United States Patent [19]

Franklin et al.

[11] 4,099,118
[45] Jul. 4, 1978

[54] ELECTRONIC WALL STUD SENSOR

[76] Inventors: Robert C. Franklin, 914 Bicknell Rd., Los Gatos, Calif. 95030; Frank I. Fuller, Rte. 1E, Box 31A, Scottsburg, Oreg. 97473

[21] Appl. No.: 818,988

[22] Filed: Jul. 25, 1977

[51] Int. Cl.² .............................................. G01R 27/26
[52] U.S. Cl. ............................ 324/61 R; 200/DIG. 1; 324/61 QS; 340/200; 340/657; 328/5
[58] Field of Search .............. 324/61 R, 61 P, 61 QS; 361/280, 281; 340/200, 258 R, 258 C, 258 B; 328/5; 200/DIG. 1

[56] References Cited

U.S. PATENT DOCUMENTS

| | | | |
|---|---|---|---|
| 2,772,394 | 11/1956 | Bradley | 324/61 R |
| 2,885,633 | 5/1959 | Cook | 324/61 R X |
| 3,043,993 | 7/1962 | Maltby | 324/61 R X |
| 3,086,109 | 4/1963 | Kaehms | 340/258 C |
| 3,694,742 | 9/1972 | Bergmanis et al. | 324/61 QS |
| 3,805,156 | 4/1974 | Norton et al. | 324/61 R |
| 3,883,800 | 5/1975 | Dupont | 324/61 R |
| 4,016,490 | 4/1977 | Weckenmann et al. | 324/61 P X |

Primary Examiner—Stanley T. Krawczewicz
Attorney, Agent, or Firm—Gerald L. Moore

[57] ABSTRACT

A portable sensor adapted to be moved along a wall to indicate a change in the dielectric constant of the wall thereby to signal the presence of a wall stud within the wall. The sensor incorporates a capacitor plate positioned adjacent the surface in contact with the wall and a circuit for detecting any change in the capacitive charge on the capacitor. Any change in capacitive charge as the sensor is moved along the wall is due to a change in the dielectric constant of the wall because of the presence of a wall stud behind the wallboard. The sensor visually indicates any change in the dielectric constant in a manner to permit selection of the center of the change in dielectric constant thereby indicating the center of the wall stud. An additional feature of the circuit permits automatic calibration of the sensor to a level corresponding to the dielectric constant of the wallboard so that any change in the dielectric constant of the wall due to the presence of a stud is readily observable.

8 Claims, 6 Drawing Figures

FIG. I.

ELECTRONIC WALL STUD SENSOR

BACKGROUND OF THE INVENTION

Building tradespersons such as carpenters, electricians, cabinet installers and the like, are often faced with the problem of locating the position of the wall studs behind the installed sheetrock or wallboard forming the wall surface. Such walls are usually formed of the wall studs positioned on 16 inches centers to which are nailed such wall materials as sheetrock or plywood of various thicknesses ranging from 1/8 inch to 3/4 inch. After the finishing and painting of the wall, the nails, and therefore the wall stud positions, are not visually detectable.

At the present time there are generally used three methods to locate the position of wall studs. The most fundamental method is to tap the wall with a hammer while listening and attempting to sense a relatively firm sound which occurs when the hammer is tapped directly over a wall stud. A second and somewhat related method is to drive a nail through the wallboard at positions spaced along a horizontal line until a wall stud is encountered. The former method does not require physical damage to the wall but the latter method is more accurate in indicating the presence and center position of the wall stud.

A third method utilizes a so-called stud finder consisting primarily of a magnet supported in a manner to pivot in the presence of a magnetic material. This finder is moved along the wall surface until it aligns with the head of a nail holding the wallboard on the stud. The location of these nails can be a tedious process. In addition, there is no assurance that the nail is centrally located on the stud thereby rendering no indication of the actual center line of the stud.

Thus it can be seen that previous attempts to locate the wall studs or whatever the purpose have been tedious and time-consuming as well as being frequently inaccurate. It is the purpose of this invention to provide an improved sensor for locating the position of wall studs or similar braces or structural supports behind wallboard within a wall.

SUMMARY OF THE INVENTION

A portable sensor for locating a wall stud positioned behind a wall surface by movement of the sensor along the wall surface comprising in combination, a capacitor plate mounted in the surface closest to the wall surface, a circuit for detecting any change in the capacitance of the capacitor plate due to a change in the dielectric constant of the wall caused by the location of a stud positioned behind the wall surface and immediately adjacent the capacitor, and means for indicating the change in capacitance of the capacitor plate, thereby indicating the wall stud position.

DESCRIPTION OF THE INVENTION

Figure 1:
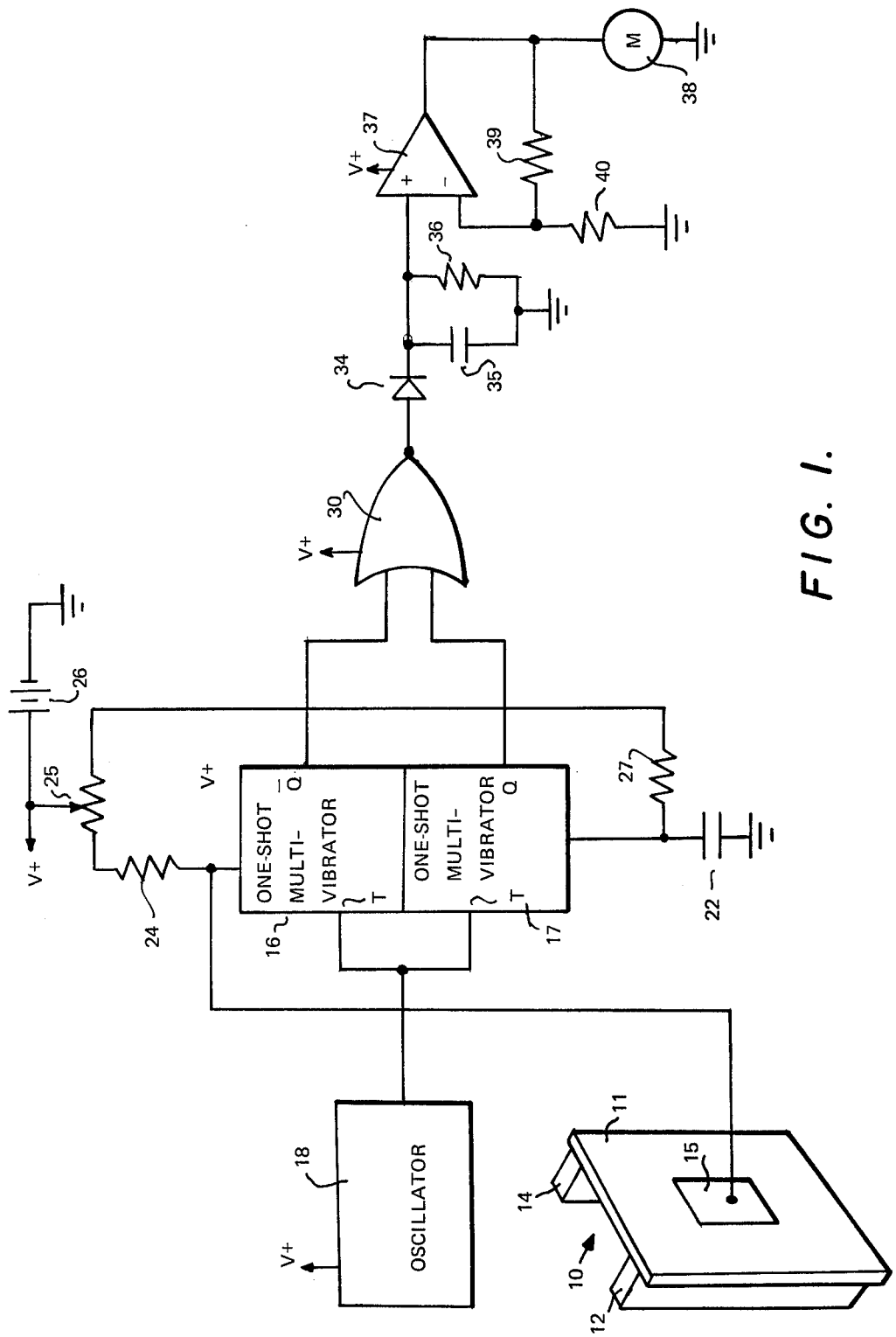
FIG. 1 is a schematic of a first embodiment of the invention.

Shown in FIG. 1 is a portion 10 of a wall structure comprising a wall covering 11 which can be made of such materials as sheetrock. Naturally when such wall coverings are placed in position they are nailed or otherwise fixed to the wall studs 12 and 14. Ordinarily with such a wall the nail heads are covered over or dressed such that they cannot be detected by observation of the wall surface. Thus as one has need to locate a wall stud for the hanging of pictures or the like, observation of the wall is not sufficient and there exists the need for a good method of detecting the actual position of the wall studs.

Figure 2:
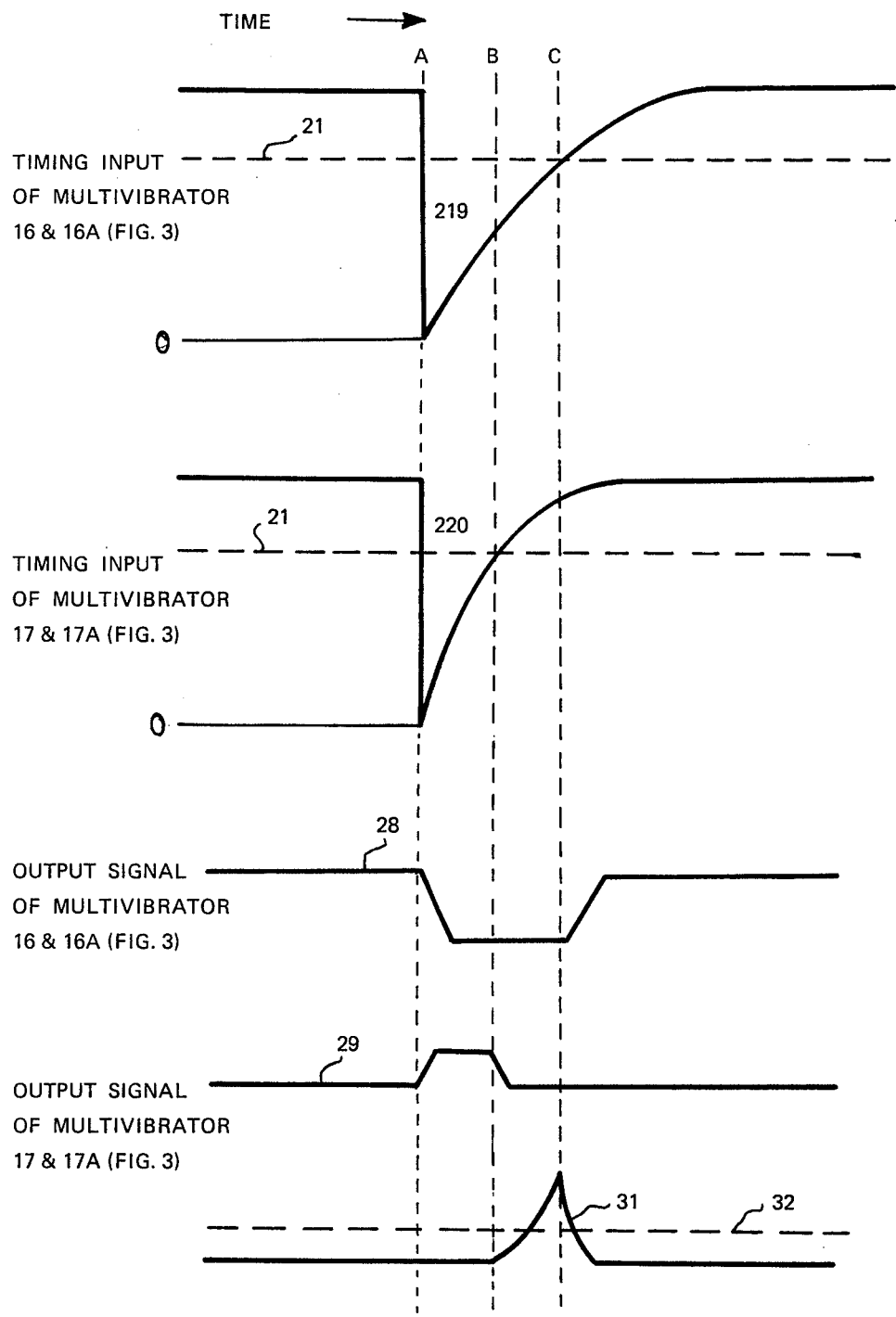
FIG. 2 shows various waveforms of the circuit of FIG. 1.

In accordance with the present invention there is provided a portable sensor for accurately locating the positions of the wall studs in the wall. The circuit diagram of a first embodiment of the device is shown in FIG. 1. The overall object of the stud finder is to sense variations in the dielectric constant of a wall as caused by the presence of a wall stud. As shown in FIG. 1, the circuit includes a sensor plate or capacitance plate 15 which can be moved along a wall such as that shown and which connects to one terminal of a first one-shot multivibrator 16. A second one-shot multivibrator 17 is also provided with an oscillator 18 connected to provide a signal for triggering both multivibrators simultaneously at a constant rate. Thus as shown in FIG. 2, the multivibrators will turn on to conduct at time A as indicated by the waveforms 19 and 20 with the waveform 19 indicating the timing input of the multivibrator 16 and the waveform 20 indicating the timing input of the multivibrator 17. One type of multivibrator suitable for use in the circuit of FIG. 1 is CMOS MC 14528 manufactured by Motorola, Inc.

At the time the multivibrators are triggered, the waveforms 19 and 20 drop to their zero levels and thereafter the waveforms rise exponentially in a positive direction towards a threshold level 21. The rate at which the outputs from the multivibrators rise is determined by the relative sizes of the capacitance of the plate 15 positioned close to the wall 10 and a fixed capacitor 22 connected to terminal 2 of the multivibrator 17. The plate 15 is connected to the terminal 14 of the multivibrator 16 and forms with the resistor 24 and the potentiometer 25 connected to a source of voltage such as the battery 26, the time constant determining circuit. Similarly the capacitor 22 and the resistor 27 in combination with the potentiometer 25 determine the time constant for the multivibrator 17. Thus it can be seen that the output or time constant of the multivibrator 17 is constant since the capacitor 22 is constant, however, because the capacitance of the plate 15 can vary as the wall dielectric constant varies, the time constant for the multivibrator 16 can change.

Thus as shown in FIG. 2 for instance, there can be caused a time difference between the termination of the output signal of multivibrator 16 and the output signal of the multivibrator 17 as indicated by the time the waveforms 19 and 20 respectively reach a threshold voltage indicated by the dotted line 21. At the time the threshold voltage is reached by each multivibrator signal, the output signal 28 of the multivibrator 16 will be at a zero level while the output signal 29 of the multibibrator 17 will be at a positive level. However at the time period B when the output of the multivibrator 17 reaches the threshold level, the output signal of that multivibrator will reduce to zero. Thereafter when the signal 19 reaches the threshold level, the output signal of multivibrator 16 goes positive.

For detection of changes in the time constants of the multivibrator output signals, these output signals are fed to the respective terminals of a NOR gate 30 which, during the time that the outputs from the multivibrators are both below the logic switching level of the NOR gate, i.e. the time difference between the level change of the multivibrator signals, will produce an output pulse 31. The peak of the waveform 31 extending above the level 32 which represents the threshold voltage of the diode 34 is thus supplied for charging a capacitor 35. The capacitor is connected in parallel with a resistor 36 which is of relatively high resistance to allow the charge on the capacitor 35 to dissipate slowly.

An operational amplifier 37 is connected in a noninverting configuration and receives the voltage corresponding to the charge on the capacitor 35 at the positive terminal to supply an amplified voltage output signal to a meter 38. The circuit of the resistors 39 and 40 are provided to energize the other terminal of the operational amplifier and determine the voltage gain of the circuit.

Thus the meter 38 indicates the charge on the capacitor 35 which in turn reflects the difference in the time of reaching the threshold voltage for the output signals of the multivibrators 16 and 17. Since this time period is based upon the relative charges of the capacitors 15 and 22 and since the charge on capacitor 15 changes with the dielectric constant of the wall, there is indicated by the meter reading the proximity of the capacitor plate 15 to a stud within the wall 10. That is, so long as the plate 15 is adjacent the wallboard between studs, the capacitance of the plate 15 remains substantially constant and the meter reading remains the same. However with the plate 15 being moved into proximity with a stud, the capacitive value of the plate 15 changes thereby changing the time constant of the multivibrator 16 resulting in a higher reading on the meter 38 becuase of the growing difference between the termination of the output signals of the multivibrators 16 and 17.

To use the sensor shown schematically in FIG. 1 the plate 15 is placed adjacent the wall in which the stud is being located. Thereafter the potentiometer 25 is adjusted until waveform 31 is very slightly positive, that is, there is a very slight indication of the transmission of a signal 31 above the conduction level of the diode 34 as shown by a low meter reading on the meter 38. Thereafter movement of the sensor along the wall and into close proximity with one of the studs 12 or 14 in the wall will cause the value of the capacitance on the plate 15 to rise resulting in a difference in conduction time between the multivibrators as indicated by the meter 38. The output signal received by the meter is shown as waveform 41 shown in FIG. 4. If by chance the meter is placed directly over a wall stud at the time calibration of the potentiometer is accomplished, movement of the sensor will not cause a rise in the meter reading but instead a falling thereof thus indicating that recalibration of the sensor is in order prior to further operation to locate a stud.

Figure 3:
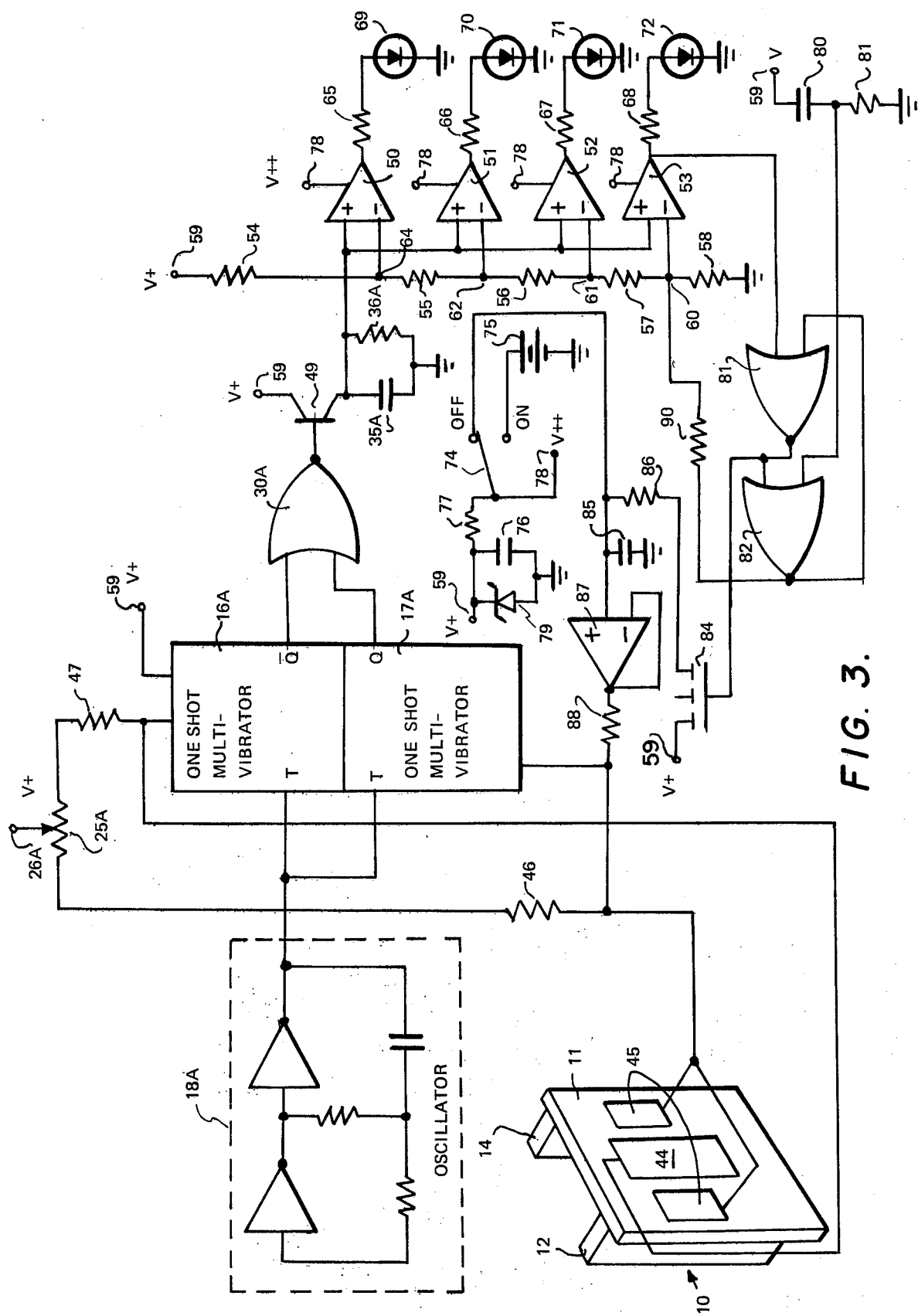
FIG. 3 shows a second embodiment of the invention in schematic form.

Shown in FIG. 3 is a second embodiment of the invention for use in locating the positions of the studs 12 and 14 in the wall 10 behind the wallboard 11. A pair of one-shot multivibrators 16A and 17A are provided which function in the same manner described in the previous embodiment. An oscillator 18A is provided for triggering these multivibrators and a potentiometer 25A connected to a voltage source $V_+$ at terminal 26A is utilized to power the circuit.

As in the previous embodiment, operation of this circuit also detects the change in capacitance of the plates as they are moved along a wall 10 and into proximity with a wall stud 12 or 14. However in accordance with one feature of this invention there is provided a plurality of capacitor plates to improve the response to the change in the dielectric constant of the wall. Accordingly the plate 44 is positioned between a pair of coupled plates 45. The plates 45 are smaller than the plates 44 in total area. In the circuit the time duration of the waveform 19 of FIG. 2, which also illustrates the timing input of the multivibrator 16A, is dependent upon the capacitance of the sensor plate 44, the resistance 47 and the setting of the potentiometer 25A. Similarly the time duration of the waveform 20 is dependent upon the capacitance of the plate 45, the value of the resistor 46 and the setting of the potentiometer 25A. Thus as the sensor is moved across the wall the capacitance 45 first reaches a stud followed thereafter by the plate 44 and subsequently by the other plate 45. As a result, the output signal of the multivibrator 17A will change first caused by an increase in the capacitance on the plates 45 because of the fact that one plate has reached a position in proximity to a stud while the plate 44 and other plate 45 have not. With further movement of the sensor to center the plate 44 over a stud and because the plate 44 is larger than the combination of the plates 45, there will be created a pulse width time difference as indicated by the waveforms 28 and 29 of FIG. 2. There will result an output signal 31 conducted through the NOR gate 30A which produces a positive output signal when both input signals 28 and 29 are simultaneously below the switching threshold of the gate.

Figure 4:
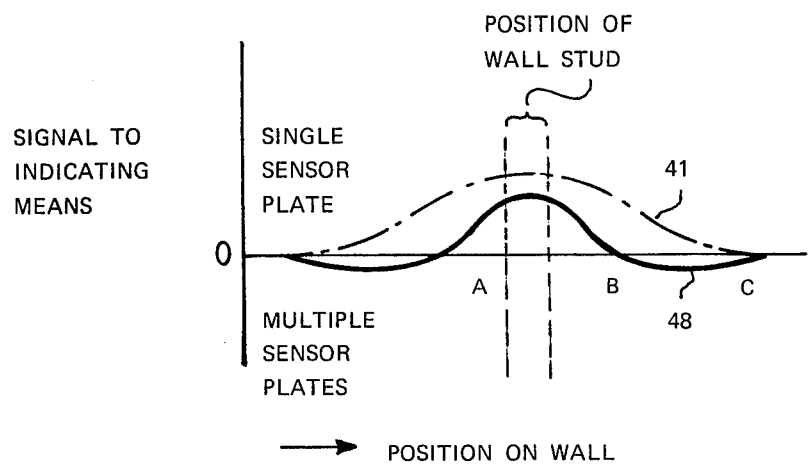
FIG. 4 shows the waveforms of the signals generated by the change in the charge on the capacitors of the circuits of FIGS. 1 and 3 caused by a change in the dielectric constant of the wall.

As shown in FIG. 4, the waveform 48 indicates the output from this circuit wherein as the leading plate 45 approaches the stud there is generated the output signal from the NOR gate 30A corresponding to the movement of the sensor position from zero to A. As the plate 44 reaches the stud position A to B, the multivibrator 16A has a longer time constant. Thereafter as the sensor is moved further the trailing plate 45 comes over the stud from the period B to C. Thus as can be seen by use of the multiple capacitor plates in the two multivibrator circuits, a more distinct or sharp waveform is obtained for detecting the difference in the capacitance of the multivibrator circuits caused by the presence of the wall stud.

In accordance with another feature of this invention, there is provided a visual digital readout means as shown in FIG. 3. For this purpose the waveform 31 is applied to the base of the transistor 49 connected as an emitter follower. The positive excursion of the waveform 48 causes an increased collector to emitter current through the transistor to charge the capacitor 35A. When the waveform 31 decreases from its peak value the voltage on the capacitor is prevented from discharging back through the emitter of the transistor 49 because of the reverse bias condition on the transistor. Thus the voltage on the capacitor 35A can only slowly discharge through the very large resistor 36A. A plurality of operational amplifiers 50, 51, 52 and 53 are connected to receive at the positive terminals a voltage signal indicative of the charge on the capacitor 35A. These amplifiers are biased at the negative terminals by a resistive voltage divider consisting of the resistors 54, 55, 56, 57 and 58 connected between ground and a terminal 59 connected to the voltage $V_+$. Thus the voltage levels at the terminals 60, 61, 62 and 64 are progressively more positive. With the voltage on the capacitor 35A equal to zero the outputs through the amplifiers 50, 51, 52 and 53 are zero volts. However as the voltage on the capacitor is increased and because of the fact that the terminal 60 is at the lowest voltage, the amplifier 53 will first become conductive and as the voltage rises further on the capacitor, the amplifiers 52, 51 and 50 will initiate conduction in consecutive order. Conduction through these amplifiers is indicated by current flow through the associated resistors 65, 66, 67 and 68 to the light emitting diodes 69, 70, 71 and 72, respectively. Thus it can be seen that as the voltage on the capacitor 35A increases, these lightemitting diodes will initiate light emission with the higest voltage on the capacitor 35A being indicated when all lightemitting diodes are emitting light.

Thus as the sensor is placed against the wall with the sensing plates adjacent the wall surface and moved therealong and a stud is approached, the first LED 72 will light and as the sensor is moved closer to the stud subsequent LEDs 71 and 70 will light. When all four LEDs are lit, or at least a maximum number of LEDs are lit, it is an indication that the sensor is positioned directly over the stud. However to assure this fact, continued movement of the sensor in the same direction will first cause the LED 69, or the topmost LED, to stop light emission followed subsequently by the LEDs 70, 71 and 72 in that order. Thus the sensor can be shifted back and forth across this position to obtain a close idea of the exact center of the stud, i.e. the area between the positions at which the LED 69 goes out as you move the sensor in each direction.

In accordance with another feature of the invention, the sensor is self-calibrating, that is the charge on the capacitor 35A is set automtically such to a value just below that voltage necessary to initiate light emission from the LED 72 because of conduction through the amplifier 53. For this purpose there is provided the circuit including the on-off switch 74 connected to the battery 75 which serves as the main power source for the sensor. Prior to turning the switch 74 to the ON position, i.e. the switch is in the OFF position, it should be noted that a calibration capacitor 85 is thus connected to ground through the circuit including the resistor 77. To calibrate the sensor it is placed against the wall surface in which the studs are to be located and the switch 74 is turned to the ON position. In this position the battery 75 is connected through the switch to energize the operational amplifiers 50, 51, 52 and 53 through the common terminal 78. In addition the voltage regulator circuit including the capacitor 76, the resistor 77 and the Zener diode 79 is energized to provide the voltage $V_+$ to the terminals 59 and 26A.

With the turning of the switch 74 to the ON position, there results a rapid increase in voltage at the terminal 59 causing a buildup in the voltage on the capacitor 80. The differentiated voltage waveform which results at the resistor 81 is applied to a terminal of the NOR gate 82 which in conjunction with the NOR gate 81 forms a bi-stable latch circuit. This bi-stable latch circuit will initially latch into a condition in which the output of the NOR gate 82 is zero volts and the output of the NOR gate 81 is positive. The latter voltage is applied to the gate terminal of the field effect transistor 84 causing it to transmit current for charging the calibration capacitor 85 by current flow through the resistor 86. The amplifier 87 has a high input impedance and is connected in a voltage follower configuration. Therefore any voltage appearing on the calibration capacitor 85 will appear as the output of the amplifier 87.

Initially with the output of the amplifier 87 being at zero volts, the waveforms 28 and 29 (FIG. 2) are substantially identical in width thereby producing no peak amplitude of the waveform 31. As the voltage on the calibration capacitor 85 and hence the output voltage of the amplifier 87 increases, the small current through the resistor 88 increases. This results in an increased charging current of the sensor plate capacitance 45 accompanied by a reduction in the pulse width of the waveform 29. As the width of the waveform 29 decreases the peak amplitude of the waveform 31 increases which in turn increases the voltage on the capacitance 35A. Thus the calibration capacitor 85 contiues to charge until the voltage on the calibration capacitor 35A reaches the threshold voltage of the amplifier 53. At this time the output of the amplifier 53 becomes positive and the LED 72 lights.

At the time the amplifier 53 becomes conductive it not only causes the LED 72 to light but also applies an input signal to the NOR gate 81 which causes the bi-stable circuit to latch in a condition where the output of the NOR gate 81 is zero and the output of the NOR gate 82 is positive. The zero output of the NOR gate 81 switches off the transistor 84 thereby trapping the charge on the calibration capacitor 85 at a level that will be held for several minutes before discharging through the connected high impedance circuits. The positive output voltage of the NOR gate 82 is applied to the resistor 90 resulting in a current flow which increases the effective threshold voltages at the negative terminals of the amplifiers 50, 51, 52 and 53. The increase in the value of this voltage causes the output of the amplifier 53 to return to zero thereby extinguishing the LED 72. Thus the calibration sequence takes only a short period of time (in the order of a few seconds) and is acknowledged by a short term lighting of the LED 72.

Moving the sensor along the wall in the manner previously described will thus cause the LEDs 72, 71, 70 and 69 to light in that order as a stud is detected. However if in the rare occurrence the sensor has been placed directly over a stud when the switch 74 is turned on, these LEDs will not come on and recalibration of the sensor is necesary. This is accomplished by first turning off the switch 74 which causes the calibration capacitor 85 to discharge. Thereafter by placing the sensor at another position on the wall surface, the switch 74 can be turned on and the calibration sequence will follow automatically.

Figure 5A:
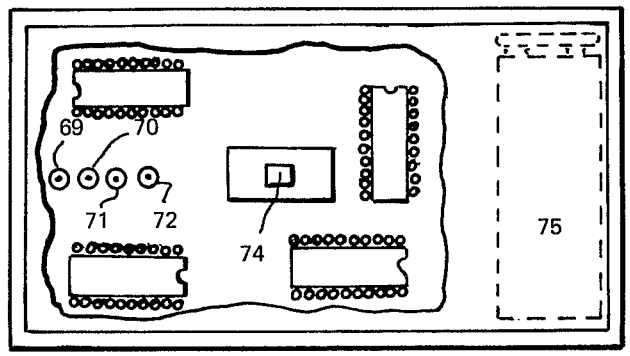
FIGS. 5A and 5B show the invention embodied in a housing.
Figure 5B:
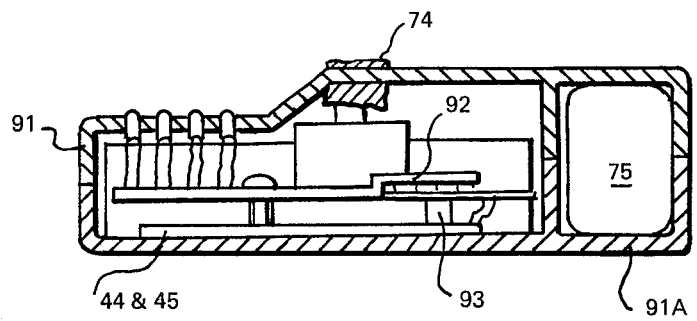

FIGS. 5A and 5B are views of one embodiment of the sensor with the circuit components placed in the housing 91. As can be seen there is provided the switch 74 having the ON and OFF positions. The LEDs 69, 70, 71 and 72 are positioned to be viewed from the top of the case with the plates 44 and 45 being placed side-by-side along he bottom surface 91A of the case. The battery 75 provides the power and the circuits are included on a circuitboard 92 supported on the support posts 93 within the case. Thus it can be seen that the sensor is packaged in a case which is approximately the size of a cigarette package for easy portability and is lightweight The invention claimed:

1. A portable device for locating a wall stud positioned behind a wall surface, comprising in combination:
a housing having a flat surface;
a capacitor plate mounted adjacent said housing flat surface;
a circuit for detecting any change in the capacitance of the capacitor plate due to a change in the dielectric constant of the wall adjacent the housing flat surface; and
means for indicating the change in the capacitance of the capacitor plate whereby by moving the device such that the flat surface thereof is in close proximity to the wall, the change in the dielectric constant caused by the stud in the wall changes the capacitance of the capacitor plate as indicated by the indicating means.

2. A portable device as defined in claim 1 including a potentiometer for supplying a charging current to the capacitor plate.

3. A device for locating a wall stud positioned behind a wall surface, comprising in combination:
a housing having a flat surface;
a pair of capacitor plates positioned side-by-side adjacent the housing flat surface;
circuit means for conducting a charge to both capacitor plates;
second circuit means for indicating any changes in the relative capacitance of the two capacitor plates; and
indicating means for indicating any detected changes in the relative capacitance of the two capacitor plates whereby by moving the housing along the wall and detecting any change in capacitance the position of a stud in the wall can be detected.

4. A device as defined in claim 3 wherein said second circuit means generates a signal which varies in amplitude in response to the variance in the relative capacitance of the two capacitor plates.

5. A device as defined in claim 4 wherein said indicating means is a plurality of light emitting devices with each light lighting at a different amplitude of the signal.

6. A device as defined in claim 5 including means to vary the level of the charge on the capacitor plates.

7. A device as defined in claim 6 wherein said circuit means for indicating the change in capacitance of the plates includes a pair of multivibrator circuits, one connected to each capacitor plate, and a circuit for turning the multivibrators on periodically; and
circuit means including the capacitor plates connected to determine the time constant of the multivibrators whereby any change in time constant thereof will indiate a change in capacitance of the capacitor plates.

8. A sensor device as defined in claim 7 including means for automatically setting the charging current to one capacitor plate responsive to the dielectric constant of the medium adjacent that capacitor plate.

* * * * *